(12) United States Patent
Tseng et al.

(10) Patent No.: US 7,994,628 B2
(45) Date of Patent: Aug. 9, 2011

(54) PACKAGE STRUCTURE OF PHOTOELECTRONIC DEVICE AND FABRICATING METHOD THEREOF

(75) Inventors: Wen Liang Tseng, Hsinchu (TW); Lung Hsin Chen, Hsinchu County (TW); Jian Shihn Tsang, Taipei County (TW)

(73) Assignee: Advanced Optoelectric Technology, Inc., Hsinchu Hsien (TW)

( * ) Notice: Subject to any disclaimer, the term of this patent is extended or adjusted under 35 U.S.C. 154(b) by 225 days.

(21) Appl. No.: 12/255,165

(22) Filed: Oct. 21, 2008

(65) Prior Publication Data

US 2009/0078956 A1 Mar. 26, 2009

Related U.S. Application Data

(62) Division of application No. 11/580,966, filed on Oct. 16, 2006, now Pat. No. 7,719,099.

(30) Foreign Application Priority Data

Oct. 21, 2005 (TW) ............................... 94136845 A
Oct. 24, 2007 (TW) ............................... 96139780 A

(51) Int. Cl.
*H01L 23/48* (2006.01)
*H01L 23/52* (2006.01)

(52) U.S. Cl. .................. 257/690; 257/98; 257/E21.499; 257/E21.058; 438/106; 438/25; 438/27; 438/28; 438/43

(58) Field of Classification Search .................. 257/690, 257/98, E21.499, E21.058; 438/106, 25, 438/28, 43, 27
See application file for complete search history.

(56) References Cited

U.S. PATENT DOCUMENTS 6,268,660 B1    7/2001    Dhong et al.
(Continued)

FOREIGN PATENT DOCUMENTS

EP    1 835 550 A2    9/2007
(Continued)

OTHER PUBLICATIONS

Search Report issued on May 26, 2010 for 08167507.6-2222, which is a corresponding European patent application, that cites US2007/018190 A1, EP1835550 A2, and JP2006135276 A.

*Primary Examiner* — Cuong Q Nguyen
*Assistant Examiner* — Cathy N Lam
(74) *Attorney, Agent, or Firm* — Raymond J. Chew

(57) ABSTRACT

A package structure for photoelectronic devices comprises a silicon substrate, a first insulating layer, a reflective layer, a second insulating layer, a first conductive layer, a second conductive layer and a die. The silicon substrate has a first surface and a second surface, wherein the first surface is opposed to the second surface. The first surface has a reflective opening, and the second surface has at least two electrode via holes connected to the reflective opening and a recess disposed outside the electrode via holes. The first insulating layer overlays the first surface, the second surface and the recesses. The reflective layer is disposed on the reflective opening. The second insulating layer is disposed on the reflective layer. The first conductive layer is disposed on the surface of the second insulating layer. The second conductive layer is disposed on the surface of the second surface and inside the electrode via holes. The die is fixed inside the reflective opening and electrically connected to the first conductive layer.

18 Claims, 14 Drawing Sheets

U.S. PATENT DOCUMENTS

| | | | |
|---|---|---|---|
| 6,531,328 B1 * | 3/2003 | Chen | 438/26 |
| 6,562,643 B2 | 5/2003 | Chen et al. | |
| 2004/0211970 A1 * | 10/2004 | Hayashimoto et al. | 257/98 |
| 2004/0218390 A1 | 11/2004 | Holman et al. | |
| 2006/0208271 A1 * | 9/2006 | Kim et al. | 257/100 |
| 2007/0018190 A1 | 1/2007 | Kim et al. | |

FOREIGN PATENT DOCUMENTS

| | | |
|---|---|---|
| JP | 2006135276 | 5/2006 |
| TW | 200834970 | 8/2008 |

\* cited by examiner

PACKAGE STRUCTURE OF PHOTOELECTRONIC DEVICE AND FABRICATING METHOD THEREOF

CROSS-REFERENCE TO RELATED APPLICATIONS

This application is related to co-pending U.S. patent application Ser. No. 11/580,966 filed Oct. 16, 2006, entitled PACKAGE STRUCTURE FOR SOLID-STATE LIGHTING DEVICES AND METHOD OF FABRICATING THE SAME, and a divisional application of U.S. application Ser. No. 11/580,966, filed on Oct. 16, 2006 now U.S. Pat. No. 7,719,099 which are commonly owned by the assignee of the present invention and the entire disclosures of which are expressly incorporated herein by reference.

BACKGROUND OF THE INVENTION

1. Field of the Invention

The present invention relates to a package structure for photoelectronic devices and a method of fabricating the same, and more particularly to a packaging and a fabricating method for a light emitting diode (LED) utilizing a silicon substrate.

2. Description of the Related Art

Among varieties of photoelectronic devices, LEDs are anticipated as the optimum light sources of the future for their compact size, high illuminating efficiency and longevity. In addition, due to the development of liquid crystal displays (LCD) and full color displays, white LEDs are now applied in consumer electronics products such as cell phones and personal digital assistants (PDA) as well as the traditional applications such as indication lamps and billboard displays.

Presently, research and development of LEDs is focused on improving the light extraction efficiency and resolving the heat dissipation problem. For the light extraction efficiency, the epitaxy process, the chip process and the packaging process can all be improved to enhance LED performance. The heat dissipation problem will mainly be solved by improving the packaging process, as advances are made in both the package structure and the package material.

For example, the light extraction efficiency of the reflective cup packaging type, one of several packaging types for LEDs, can be enhanced by increasing the light reflection rate. Furthermore, suitably modified designs of the reflective cup can also improve the heat dissipation efficiency. U.S. Pat. No. 6,562,643 put forth such a modified design, and U.S. Pat. No. 6,268,660 and U.S. patent publication No. 2004/0218390 have the same objectives. Moreover, U.S. Pat. No. 6,531,328 discloses that a silicon substrate 80 substitutes for a package substrate. Several reflective cups 81 are formed on the silicon substrate 80 by MEMS (micro electromechanical system) processes, as shown in FIG. 1. An insulation layer 82 and a metal layer 83 sequentially enclose the silicon substrate 80, and electrodes 831 and 832 are formed adjacent to the metal layer 80. Attached to the interior of each reflective cup 81 is an LED die 84, wherein the LED die 84 is electrically connected to the corresponding reflective cup 81 by bonding wires. An epoxy resin 85 encapsulates and therefore protects the LED die 84 in the corresponding reflective cup 81. There are two partial-depth holes 86 on each side of each reflective cup 81. The purpose of the two partial-depth holes, however, is not mentioned in U.S. Pat. No. 6,531,328.

FIG. 2 is a flow chart of the manufacturing process of the device in FIG. 1. As shown in Step S91, the silicon substrate 80 is first provided for these steps. Subsequently, a plurality of reflective cavities is formed on the first surface of the silicon substrate 80 by wet etching, as shown in Step S92. Referring to Step S93, electrode guiding holes are formed on the second surface opposite to the first surface by dry etching. Insulation layers are deposited on the surfaces of the silicon substrate 80 by a thermal oxidation method or a thermal nitrogenization method, as shown in Step S94. The insulation layers can be made of $SiO_2$ or $Si_3N_4$. Subsequently, conductive layers are deposited on the insulation layers by electroplating, as shown in Step S95. Finally, a reflective layer is formed on the reflective cavities, and the electrodes 831 and 832 are arranged on the opposite surface by laser treatment, as shown in Step S96.

The aforesaid structure of the LEDs on the silicon substrate has several shortcomings. First, the reflective layer and the electrodes are made of the same material. There is currently no metal simultaneously suitable for optimizing both reflectivity and solderability. Furthermore, due to the fact that various LEDs emit light with different wavelengths, and that reflective efficiency of the metal is directly related to the emitting wavelengths, the optimal material for the electrodes varies accordingly. Solder is preferable for the material of the electrodes, but is not a suitable material for reflecting visual light. Au, Ag, Pd and Pt are better reflective materials, but none of these is suitable as material of electrodes.

In addition, the formation of the lowermost guiding holes adapts the dry etching technique, wherein the etched pattern has less adaptability in subsequent processes. Moreover, the metal layer needs laser treatment to form reflective surfaces, resulting in higher manufacturing costs.

In an R.O.C. patent publication (publication No. 200834970), the Applicant solved most of the problems of the aforesaid prior art. However, the resistivity of the silicon substrate adapted in R.O.C. patent publication No. 200834970 is required to be over 800Ω·cm. Otherwise, the solder may flow from the electrodes to the lateral surface of the silicon substrate and cause a short circuit. The manufacturing cost of high resistivity silicon substrate, however, is much higher than that of the low resistivity silicon substrate and is therefore the main drawback of the R.O.C. patent publication.

Consequently, there is a need in the optoelectronic market for high power photoelectronic devices or LED technology that is reliable and exhibits a simple structure that solves the aforesaid problems.

SUMMARY OF THE INVENTION

The present invention provides a package structure for photoelectronic devices and a method of fabricating the same. A silicon substrate is used as the package substrate to enhance heat dissipation efficiency. Furthermore, MEMS processes can be effectively applied to the substrate.

The present invention also provides a package structure for photoelectronic devices and a method of fabricating the same, wherein a recess part is disposed on the external side of the electrode of each photoelectronic device. An insulating layer encloses the recess part such that the solder cannot flow from the electrode to the lateral surface of the silicon substrate, and short circuit is thus prevented.

The present invention also provides a low cost package structure for photoelectronic devices and a method of fabricating the same, which adapts low cost silicon substrate with low resistivity for the package structure such that the manufacturing cost is greatly reduced.

The present invention allows the usage of different materials for the reflective layer and electrodes. The material of the reflective layer is selected based on the requirement to reflect light of specific wavelengths without affecting the choice of electrode material. Therefore, optimal materials are respectively selected for the reflective layer and the electrodes.

The present invention may adapt wet etching technique to form electrodes via holes at the bottom of the device to leave more space for subsequent process windows.

The present invention also provides an insulating layer to protect the metal in the reflective layer from oxidation, vulcanization, or reaction with other chemical substances. The thickness of the insulating layer could be adjusted to produce constructive interference of specific rays.

A package structure for photoelectronic devices according to one embodiment of the present invention comprises a silicon substrate, a first insulating layer, a reflective layer, a second insulating layer, a first conductive layer, a second conductive layer and a die. The silicon substrate has a first surface and a second surface, wherein the first surface is opposed to the second surface. The first surface has a reflective opening, and the second surface has at least two electrode via holes connected to the reflective opening and a recess located outside each of the electrode via holes. The first insulating layer overlays the first surface, the second surface and the recesses. The reflective layer is disposed on the reflective opening. The second insulating layer is disposed on the reflective layer. The first conductive layer is disposed on the surface of the second insulating layer. The second conductive layer is disposed on the surface of the second surface and inside the electrode via holes. The die is fixed inside the reflective opening and electrically connected to the first conductive layer.

Preferably, the first insulating layer is made of silicon oxide, and the second insulating layer is made of silicon dioxide, silicon nitride or silicon oxynitride.

Preferably, the reflective layer is made of aluminum (Al), silver (Ag), gold (Au), tin (Ti), copper (Cu) or platinum (Pt), and the thickness thereof is between 300 angstroms and 20,000 angstroms.

Preferably, the first conductive layer is extended to and connected with the second conductive layer, wherein the first conductive layer and the second conductive layer are made of a solderable material, such as silver (Ag), nickel/gold (Ni/Au), titanium/gold (Ti/Au), titanium/nickel/gold (Ti/Ni/Au), titanium/copper/nickel/gold (Ti/Cu/Ni/Au), titanium/tungsten/copper/nickel/gold (TiW/Cu/Ni/Au) or chromium/copper/nickel/gold (Cr/Cu/Ni/Au).

The package structure of this embodiment of the present invention further comprises an encapsulating layer filled in the reflective opening.

Preferably, the die is electrically connected to the first conductive layer via a plurality of bumps.

A package structure for photoelectronic devices according to another embodiment of the present invention comprises a silicon substrate, a first insulating layer, a metal layer, a second insulating layer, an electrode layer and a die. The silicon substrate has a first surface and a second surface, wherein the first surface is opposed to the second surface, the first surface has a reflective opening thereon, the second surface has a plurality of electrode via holes connected to the reflective opening, and at least one recess formed on the second surface is located outside each of the electrode via holes. The first insulating layer overlays the first surface, the second surface and the recesses. The metal layer is disposed inside the reflective opening, comprising a reflective area and a conductive area. The second insulating layer is disposed on the reflective area. The electrode layer is disposed on the surface of the first insulating layer and inside the electrode via holes. The die is fixed inside the reflective opening and electrically connected to the conductive area of the metal layer.

Preferably, the reflective area is made of aluminum (Al), silver (Ag), gold (Au), tin (Ti), copper (Cu) or platinum (Pt).

Preferably, the electrode layer is connected to the conductive area of the metal layer, wherein the electrode layer and the metal layer are made of a solderable material, such as silver (Ag), nickel/gold (Ni/Au), titanium/gold (Ti/Au), titanium/nickel/gold (Ti/Ni/Au), titanium/copper/nickel/gold (Ti/Cu/Ni/Au), titanium/tungsten/copper/nickel/gold (TiW/Cu/Ni/Au) or chromium/copper/nickel/gold (Cr/Cu/Ni/Au).

A fabrication method of a package structure for photoelectronic devices according to another embodiment of the present invention comprises the steps of: providing a silicon substrate; forming at least one reflective opening on a first surface of the silicon substrate; forming a plurality of electrode via holes and recesses on a second surface of the silicon substrate, wherein the electrode via holes penetrate through the silicon substrate to reach the at least one reflective opening, and the recesses are located outside the electrode via holes; forming a first insulating layer overlaying the at least one reflective opening, the plurality of electrode via holes and recesses; forming a reflective layer inside the at least one reflective opening; forming a second insulating layer on the reflective layer; forming a first conductive layer on the second insulating layer; forming a second conductive layer on the second surface of the silicon substrate and inside the electrode via holes; and fixing a die inside the reflective opening and electrically connecting the die with the first conductive layer.

Preferably, the first insulating layer is made of silicon oxide formed by a hot oxidation process, and the second insulating layer is made of silicon dioxide, silicon nitride or silicon oxynitride deposited by vapor deposition process.

Preferably, the first conductive layer and the second conductive layer are formed by electroplating, evaporating or chemical plating techniques, and the first conductive layer is connected to the second conductive layer.

Preferably, the die is fixed inside the reflective opening by flip-chip or wire bonding technique.

Preferably, the fabrication method of this embodiment further comprises the step of filling an encapsulating layer inside the reflective opening and the electrode via holes.

A fabrication method of a package structure for photoelectronic devices according to another embodiment of the present invention comprises the steps of: providing a silicon substrate; forming at least one reflective opening on a first surface of the silicon substrate; forming a plurality of electrode via holes and recesses on a second surface of the silicon substrate, wherein the electrode via holes penetrate through the silicon substrate to reach the at least one reflective opening, and the recesses are located outside the electrode via holes; forming a first insulating layer overlaying the at least one reflective opening, the plurality of electrode via holes and recesses; forming a metal layer inside the at least one reflective opening, wherein the metal layer comprises a reflective area and a conductive area; forming a second insulating layer at the reflective area; forming an electrode layer on the second surface of the silicon substrate and inside the electrode via holes; and fixing a die inside the reflective opening and electrically connecting the die with the first conductive area.

Preferably, the metal layer and the electrode layer are formed by electroplating, evaporating or chemical plating techniques.

A package structure for photoelectronic devices according to another embodiment of the present invention comprises a silicon substrate, a first insulating layer, a reflective layer, a second insulating layer, a first conductive layer and a second conductive layer. The silicon substrate has a first surface and a second surface opposite to each other, wherein the first surface has a reflective opening thereon, the second surface has at least two electrode via holes thereon connected to the reflective opening, and the second surface also has at least one recess located outside each of the electrode via holes. The first insulating layer overlays the first surface, the second surface and the recess. The reflective layer is disposed on the reflective opening. The second insulating layer is disposed on the reflective layer. The first conductive layer is disposed on the at least two electrode via holes, wherein the first conductive layer serves as two electrode pads and is electrically isolated from the reflective layer. The second conductive layer is disposed beneath the second surface and inside the at least two electrode via holes.

Preferably, the first conductive layer and the second conductive layer are made of a solderable material, wherein the first conductive layer is electrically connected to the second conductive layer.

Preferably, the first conductive layer and the second conductive layer are formed by pattern transfer etching or lift-off process.

BRIEF DESCRIPTION OF THE DRAWINGS

The invention will be described according to the appended drawings in which.

PREFERRED EMBODIMENT OF THE PRESENT INVENTION

Figure 3A:
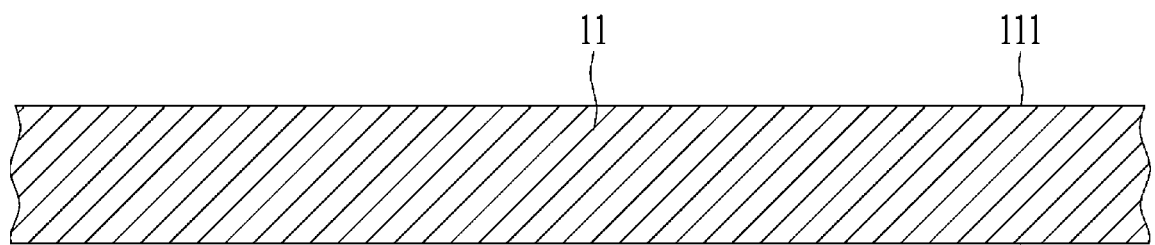
FIG. 3A to 3N show the flow chart of an embodiment of the manufacturing method for photoelectronic devices of the present invention.
Figure 3B:
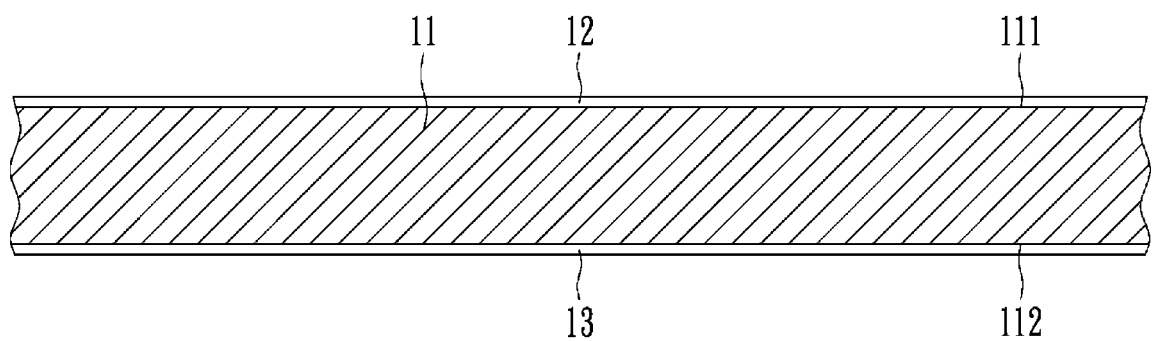
Figure 3C:
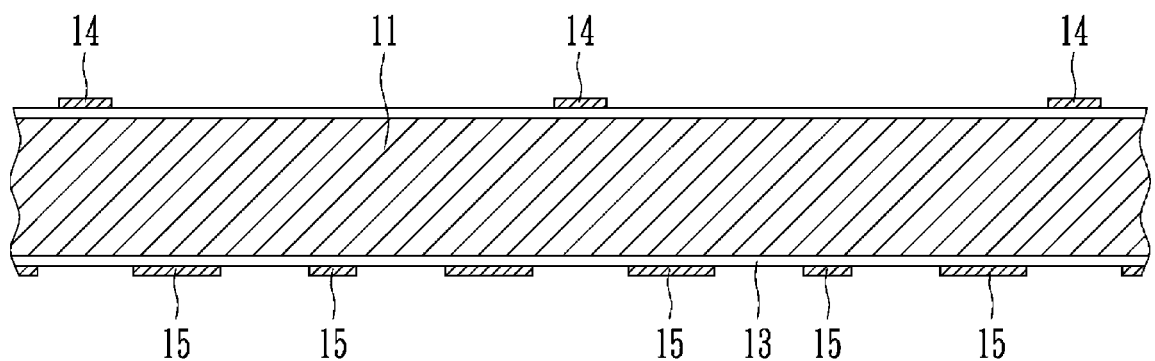
Figure 3D:
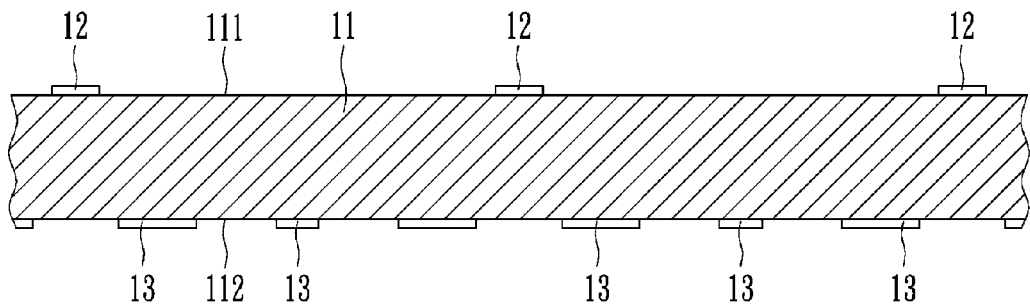
Figure 3E:
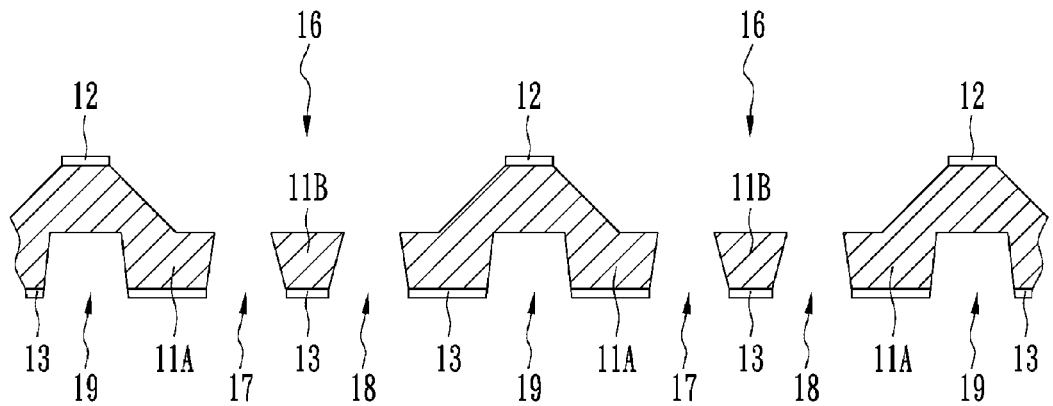
Figure 3F:
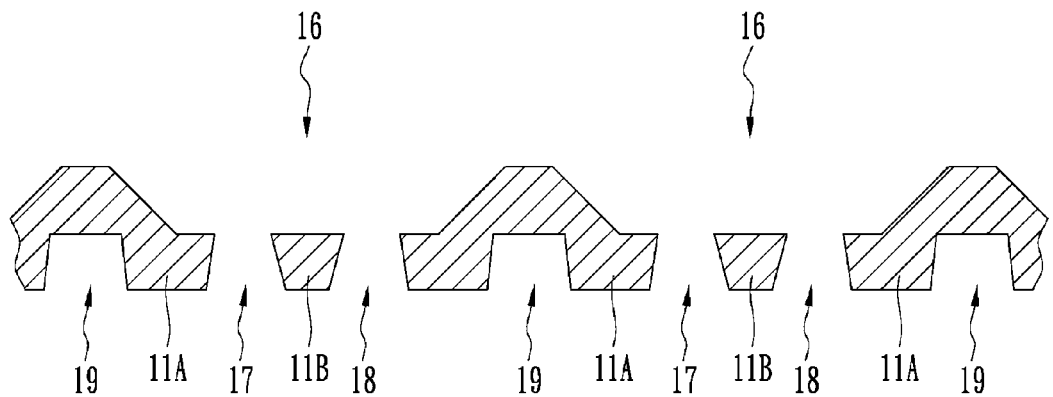
Figure 3G:
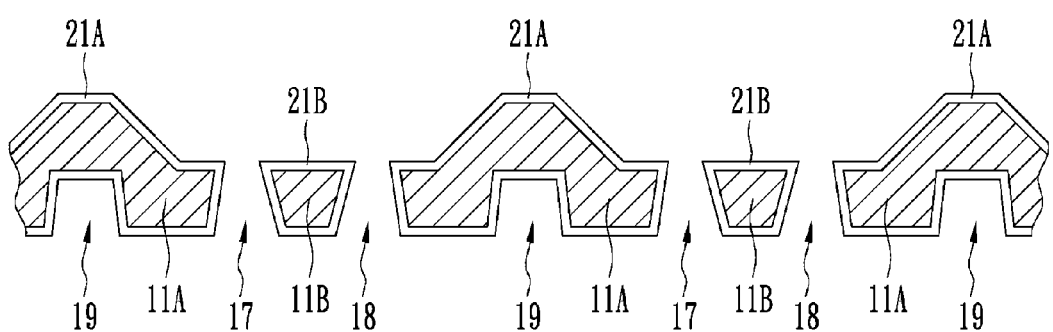
Figure 3H:
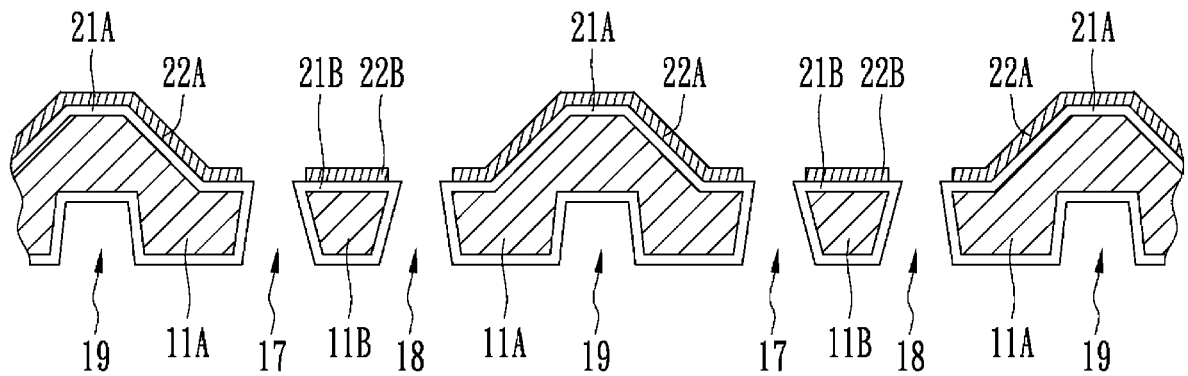
Figure 3I:
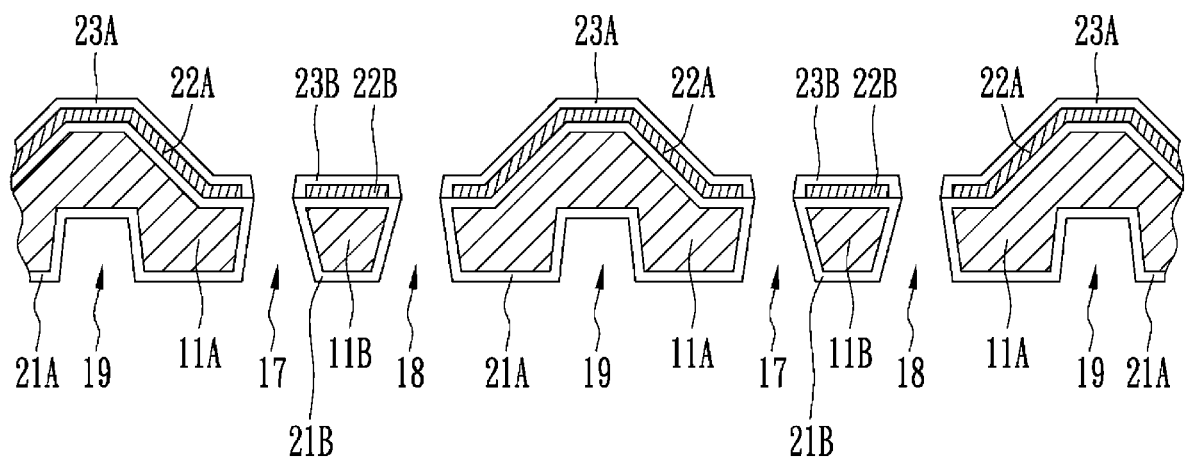
Figure 3J:
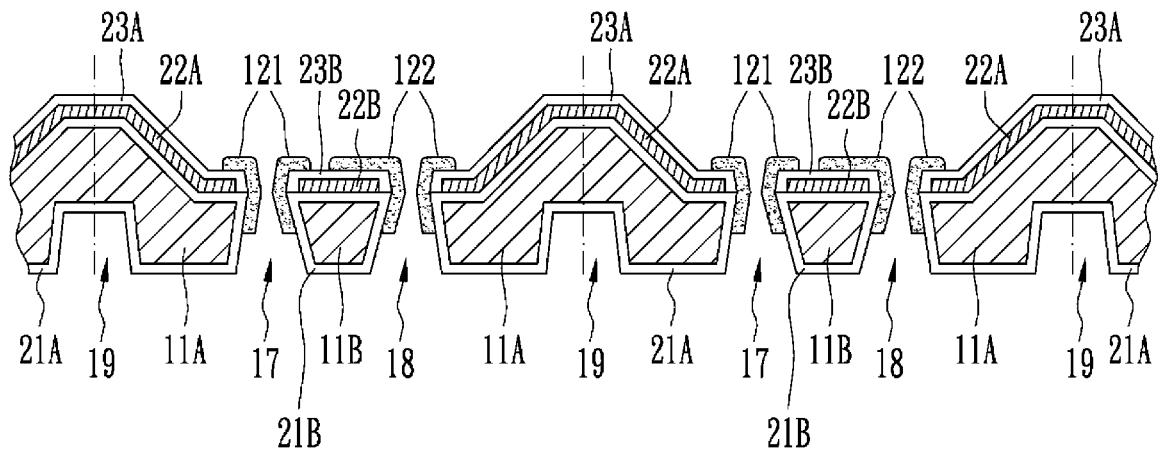
Figure 3K:
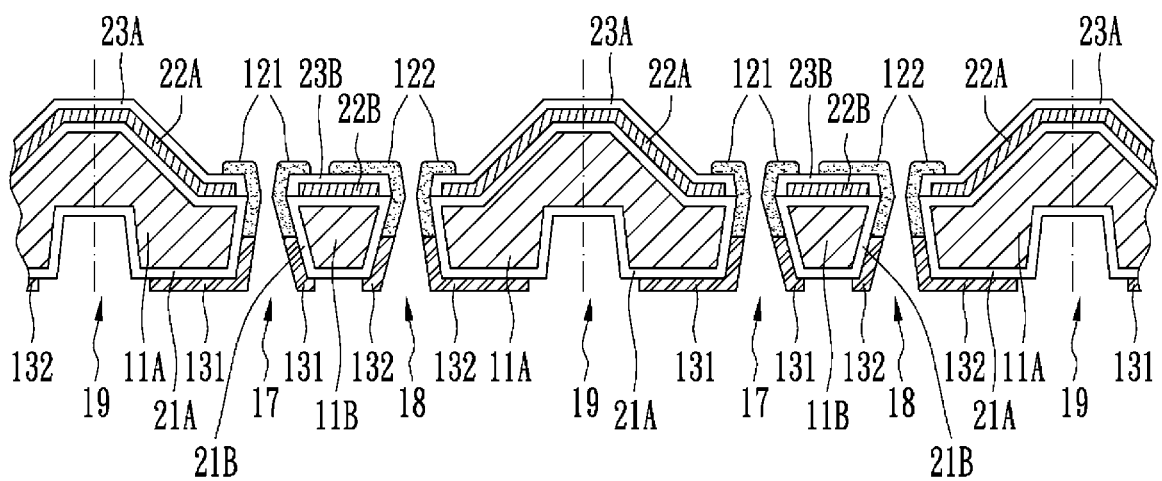
Figure 3L:
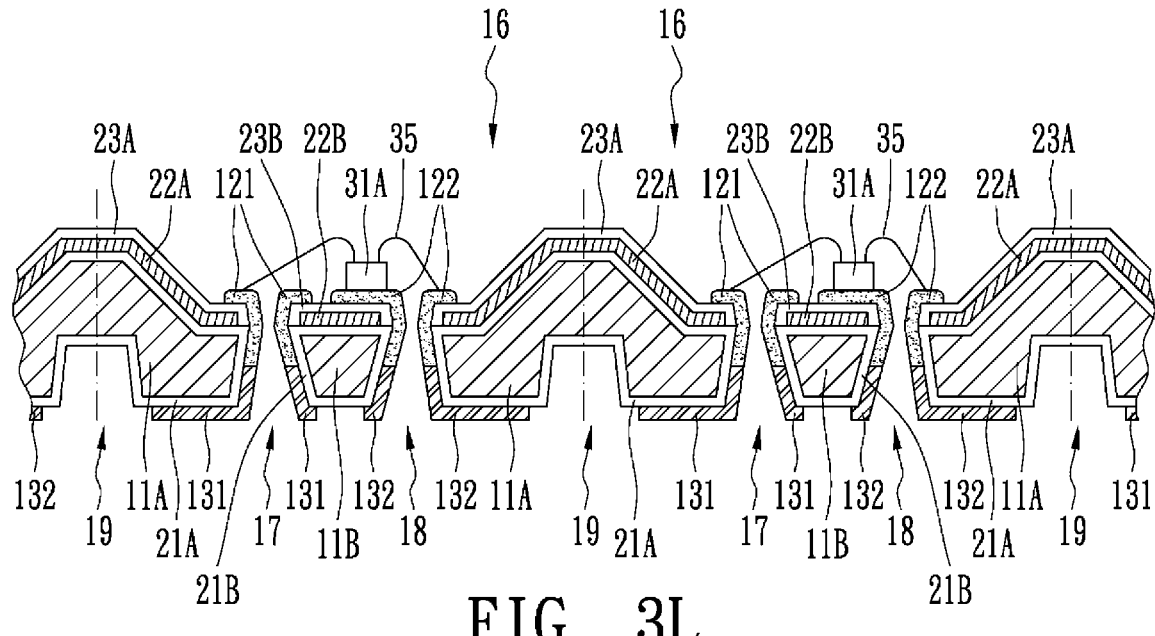
Figure 3M:
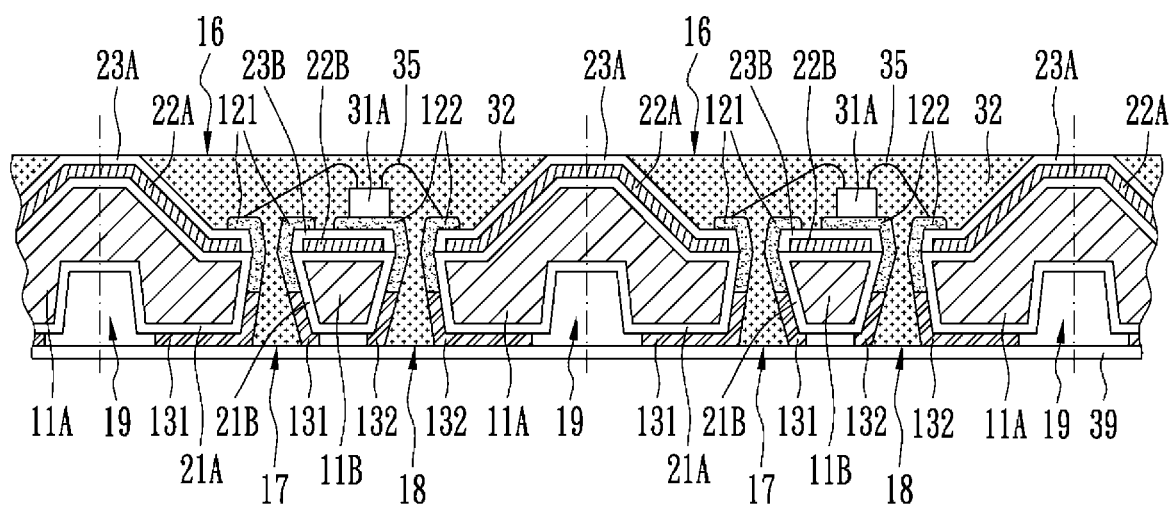
Figure 3N:
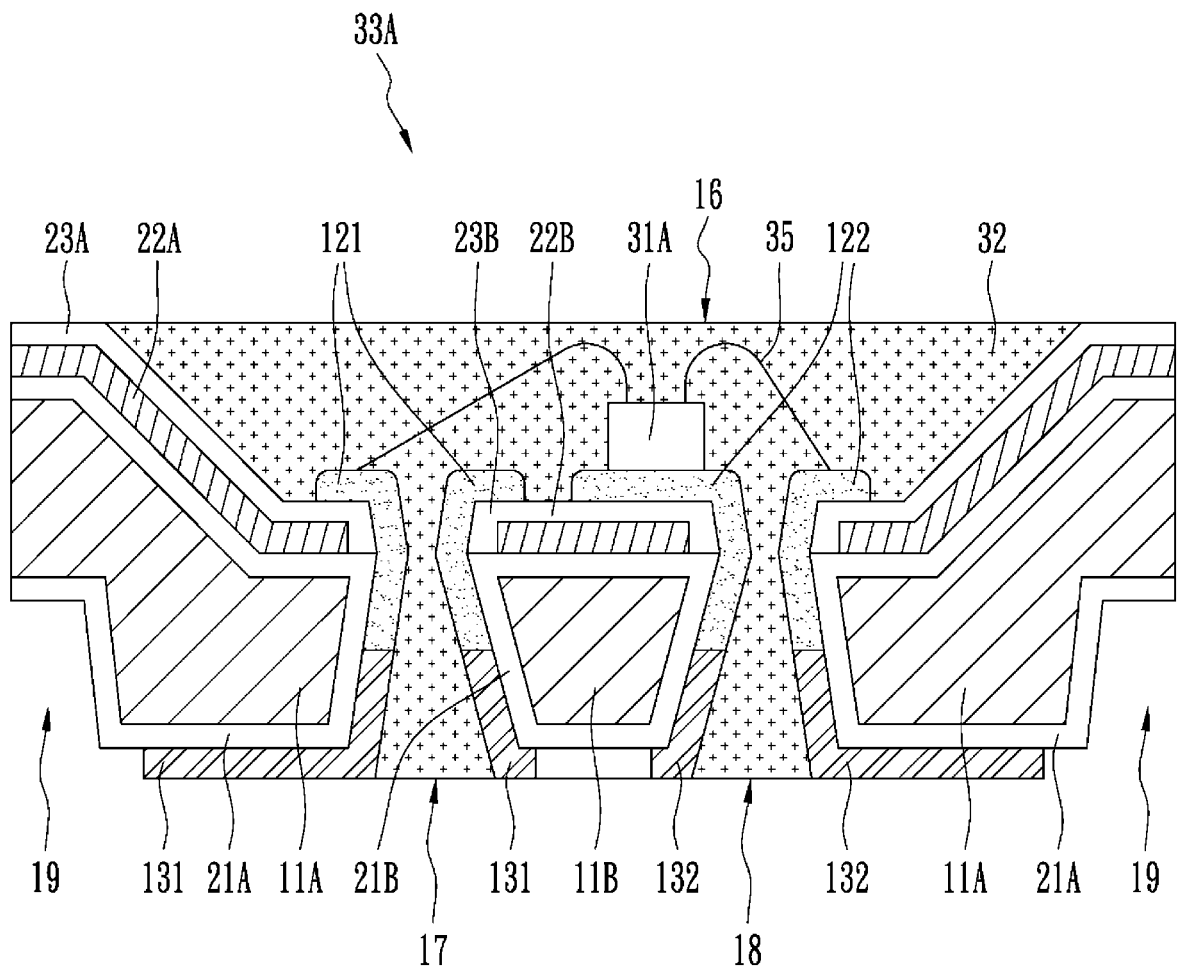

FIG. 3A to 3N show the flow chart of an embodiment of the manufacturing method for photoelectronic devices of the present invention. As shown in FIG. 3A, a silicon substrate 11 is provided, which comprises a first surface 111 and a second surface 112, wherein the first surface 111 is the upper surface and the second surface 112 is the lower surface. The silicon substrate 11 can be a 5-inch, 6-inch, 8-inch or 12-inch silicon wafer with low resistivity (<200Ω·cm). The silicon substrate 11 may adapt a <100> crystal orientation surface. The silicon atoms can be categorized as single crystal silicon, polysilicon and amorphous silicon according to the crystallization process. A few important advantages offered by the silicon substrate 11 are its great heat dissipation capability and its suitability for well-developed semiconductor process or MEMS process.

As shown in FIG. 3B, the silicon substrate 11 is then covered by dielectric layers 12 and 13 (or an insulating layer). The step shown in FIG. 3B can be accomplished by deposition process with plasma-enhanced chemical vapor deposition (PECVD) technique. The material of the dielectric layers 12 and 13 is selected such that it can be etched by an anti-silicon anisotropic etchant. The selection of the anti-silicon anisotropic etchant can be potassium (KOH), tetramethyl ammonium hydroxide (TMAH), ethylenediamine pyrocatochol (EDP) or $N_2H_4$. The material of the dielectric layers 12 and 13 can be silicon nitride ($Si_3N_4$), silicon dioxide or silicon oxynitride. In this embodiment, the dielectric layers 12 and 13 are made of silicon nitride. As shown in FIG. 3C, the dielectric layers 12 and 13 are then respectively covered by patterned photoresist layers 14 and 15.

As shown in FIG. 3D, the portion of the dielectric layers 12 and 13 not covered under the photoresist layers 14 and 15 is then removed by etching. The photoresist layers 14 and 15 are subsequently removed also. As shown in FIG. 3E, the portion of the first surface 111 not covered under the dielectric layer 12 is etched away to form a plurality of reflective openings 16 and recesses 19. Likewise, the portion of the second surface 112 not covered under the dielectric layer 13 is etched away to form a plurality of electrode via holes 17 and 18 and recesses 19.

As shown in FIGS. 3E and 3F, the remaining dielectric layers 12 and 13 are then removed. The remaining silicon substrate 11 comprises a plurality of base part 11B and a plurality of cup part 11A. If the dielectric layers 12 and 13 are made of silicon nitride, a heated phosphoric acid can be selected to etch away the remaining dielectric layers 12 and 13. As shown in FIG. 3G, the base parts 11A and the cup parts 11B are then exposed under a high temperature environment with ample oxygen a period of time to form a first insulating layer 21A and 21B covering the base parts 11A and the cup parts 11B. The first insulating layer 21A and 21B is made of silicon dioxide in this embodiment, which has good adherence with silicon and meets the dielectric property requirement.

The chemical reaction function describing the oxidation reaction of silicon under oxygen or water vapor is shown as follows:

Dry oxidation:

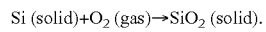

$$Si\ (solid) + O_2\ (gas) \rightarrow SiO_2\ (solid).$$

Wet oxidation:

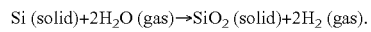

$$Si\ (solid) + 2H_2O\ (gas) \rightarrow SiO_2\ (solid) + 2H_2\ (gas).$$

In this embodiment, the first insulating layer 21A and 21B is hot oxide generated from a wet oxidation reaction, wherein the reaction temperature is between 900 and 1100 degrees Centigrade. Due to the short reaction time, the thickness of the first insulating layer 21A and 21B is between 30 and 10,000 angstroms.

As shown in FIGS. 3H-3I, the first insulating layer 21A and 21B is then covered by a reflective layer 22A and 22B, which can be accomplished by deposition process with physical vapor deposition (PVD) technique. As shown in FIG. 3I, the reflective layer 22A and 22B is then covered by a second insulating layer 23A and 23B, which is a passivation layer generated by PECVD technique. The main purpose of the second insulating layer 23A and 23B, which may be made of silicon dioxide, silicon nitride or silicon oxynitride, is to protect the metal in the reflective layer 22A and 22B from oxidation.

Silicon oxynitride has a similar property with silicon dioxide and silicon nitride. Silicon oxynitride has a smoother stress than silicon nitride, and has better impermeability to water and impurity than silicon dioxide. Therefore, silicon oxynitride is often used as the material for protection layer. Although silicon oxynitride can also deposit under a high temperature environment (>850 degrees Centigrade) with low pressure chemical vapor deposition (LPCVD) technique, to prevent the metal layer of the silicon substrate from being polluted, it is required that the reaction temperature of the silicon oxynitride, which serves as a protection layer, is not higher than 400 degrees Centigrade. Therefore, the deposition process of the silicon oxynitride nowadays is accomplished by PECVD technique.

As shown in FIGS. 3J-3K, a conductive layer 121 and 122 is then formed on the surface of the second insulating layer 23A and 23B and extended to the surface of the first insulating layer 21A and 21B. The conductive layer 121 and 122 is made of a solderable material, wherein the material thereof is selected according to the following packaging process and may be silver (Ag), nickel/gold (Ni/Au), titanium/gold (Ti/Au), titanium/nickel/gold (Ti/Ni/Au), titanium/copper/nickel/gold (Ti/Cu/Ni/Au), titanium/tungsten/copper/nickel/gold (TiW/Cu/Ni/Au) or chromium/copper/nickel/gold (Cr/Cu/Ni/Au). The pattern transfer of the conductive layer 121 and 122 can be accomplished by photolithography process (i.e. the pattern is transferred by etching) or lift-off process. The formation of the conductive layer 121 and 122 can be accomplished by electroplating, evaporating or chemical plating techniques.

The main purpose of the reflective layer 22A and 22B is to increase the brightness of the photoelectronic device. The material of the reflective layer 22A and 22B can be the same as that of the conductive layer 121 and 122, such as aluminum/nickel/gold (Al/Ni/Au), or it may be different from that of the conductive layer 121 and 122, such as aluminum (Al), silver (Ag), gold (Au), tin (Sn), copper (Cu) or platinum (Pt) according to different requirement of wavelength. The thickness of the reflective layer 22A and 22B is between 300 and 20,000 angstroms.

As shown in FIG. 3K, backend electrodes 131 and 132 are then disposed on the lower part of the first insulating layer 21A and 21B, wherein the electrode 131 is electrically connected to the conductive layer 121, and the electrode 132 is electrically connected to the conductive layer 122. The electrodes 131 and 132 can be made of solderable material or any material with good conductivity such as gold (Au), nickel/gold (Ni/Au), titanium/gold (Ti/Au), titanium/nickel/gold (Ti/Ni/Au), titanium/copper/nickel/gold (Ti/Cu/Ni/Au), titanium/tungsten/copper/nickel/gold (TiW/Cu/Ni/Au) or chromium/copper/nickel/gold (Cr/Cu/Ni/Au). The pattern transfer of the electrodes 131 and 132 can be accomplished by photolithography process (i.e. the pattern is transferred by etching) or lift-off process. The formation of the conductive electrodes 131 and 132 can be accomplished by electroplating, evaporating or chemical plating techniques.

As shown in FIG. 3L, a plurality of photo semiconductor dies 31A is then fixed in the reflective openings 16 of the conductive layer 122 and electrically connected to the conductive layer 121 and 122 via wire bonding technique, i.e., the plurality of photo semiconductor dies 31A is electrically connected to the conductive layer 121 and 122 by metal wires 35.

As shown in FIGS. 3M-3N, an encapsulating layer 32 is then formed inside the reflective openings 16 and the electrode via holes 17 and 18 after sealing the electrode via holes 17 and 18 by a tape adhesive 39. After the encapsulating layer 32 is solidified, the tape adhesive 39 is then removed. Other than the tape adhesive 39, there are other encapsulating sealing materials which can be used to prevent the encapsulating layer 32 leaking from the electrode via holes 17, such as thin plate material or mold. Finally, as shown in FIG. 3N, the base part 11B is cut out to form a single photoelectronic device 33A. There is at least one recess 19 at each side of the photoelectronic device 33A, which is also at the external side of the electrode via holes 17 and 18. When the photoelectronic device 33A is to be soldered onto a printed circuit board, the recesses 19 covered by the first insulating layer 21A can prevent the solder from leaking and flowing to the lateral surface of the cup part 11A (silicon substrate), which may cause short circuit. That is, the recesses 19 can contain the leakage of the solder such that the solder will not flow to the lateral surface of the cup part 11A, which is not covered by the insulating layer 21A. When a low resistivity silicon substrate is used for the cup part 11A and the base part 11B, the short circuit problem of the photoelectronic device 33A caused by solder leakage is particularly serious. In this embodiment, this problem is solved completely.

Figure 1:
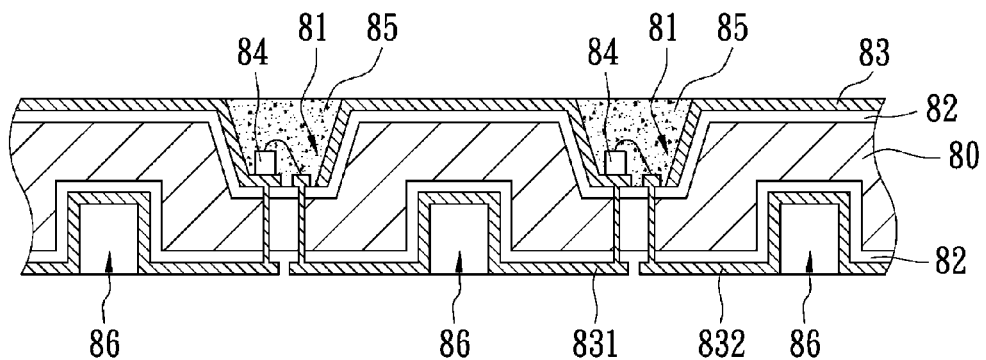
FIG. 1 is a diagram showing a conventional package structure for an LED.
Figure 2:
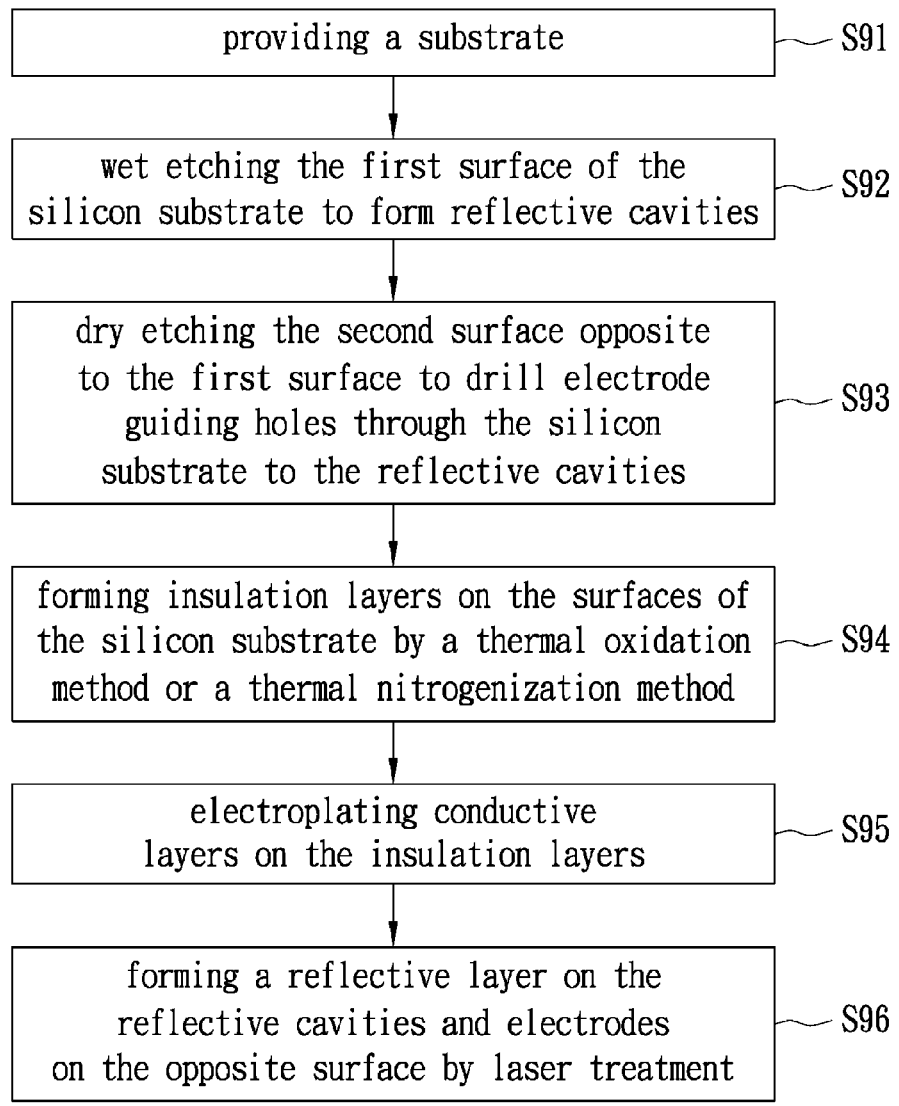
FIG. 2 is a flow chart for fabricating the package structure in FIG. 1.

Referring to FIG. 1, it can be seen that there is still a part of silicon substrate exposed outside the semi-through holes 86. Therefore, the leakage of the solder will not be fully contained in the semi-through holes 86. Instead, the solder will flow to the part of the silicon substrate not covered by the insulating layer and cause short circuit. In this embodiment, on the other hand, the recesses 19 can contain the leakage of the solder such that the solder will not flow to the lateral surface of the cup part 11A. In addition, the structure of the prior art shown in FIG. 1 and that of this embodiment are different in many ways, which demonstrates the patentability of the present invention.

Figure 4A:
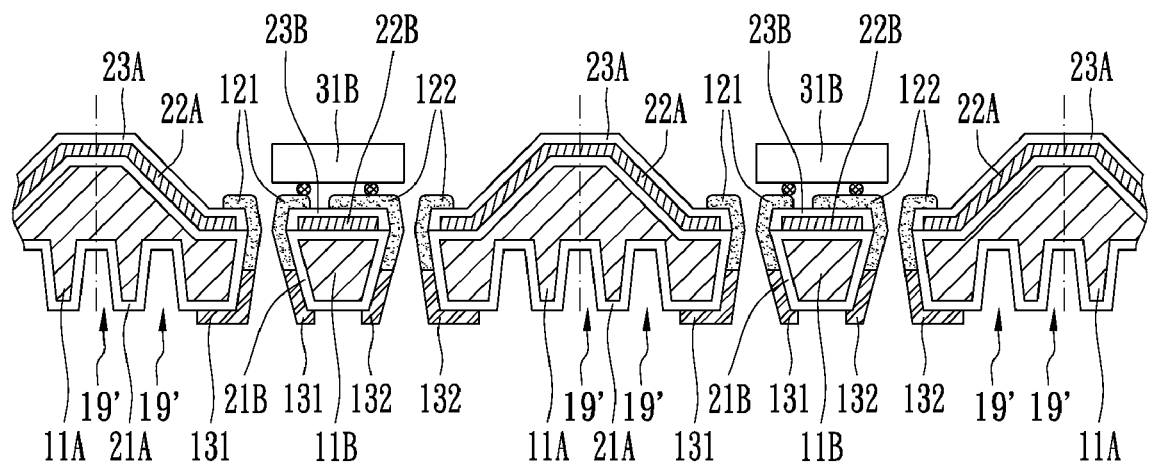
FIG. 4A to 4C show the flow chart of another embodiment of the manufacturing method for photoelectronic devices of the present invention.
Figure 4B:
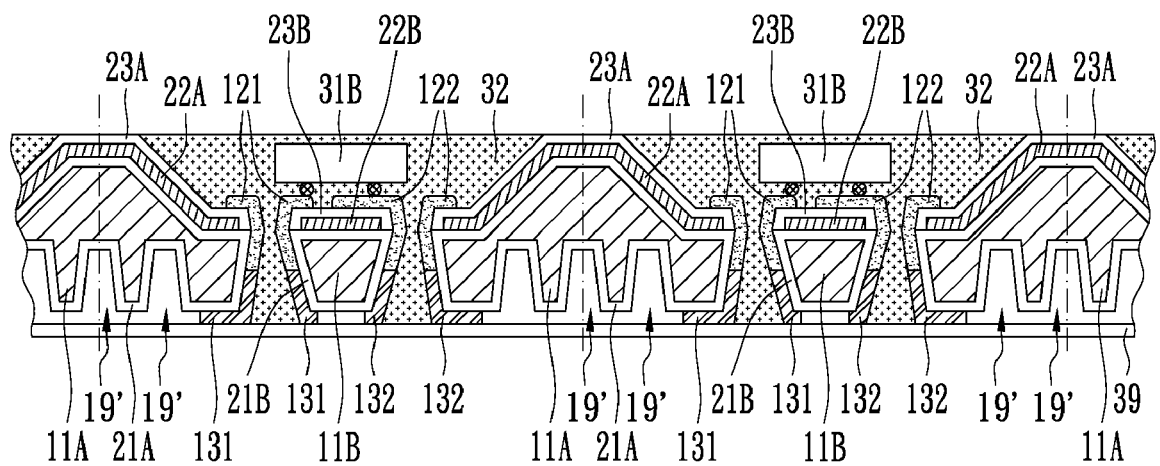
Figure 4C:
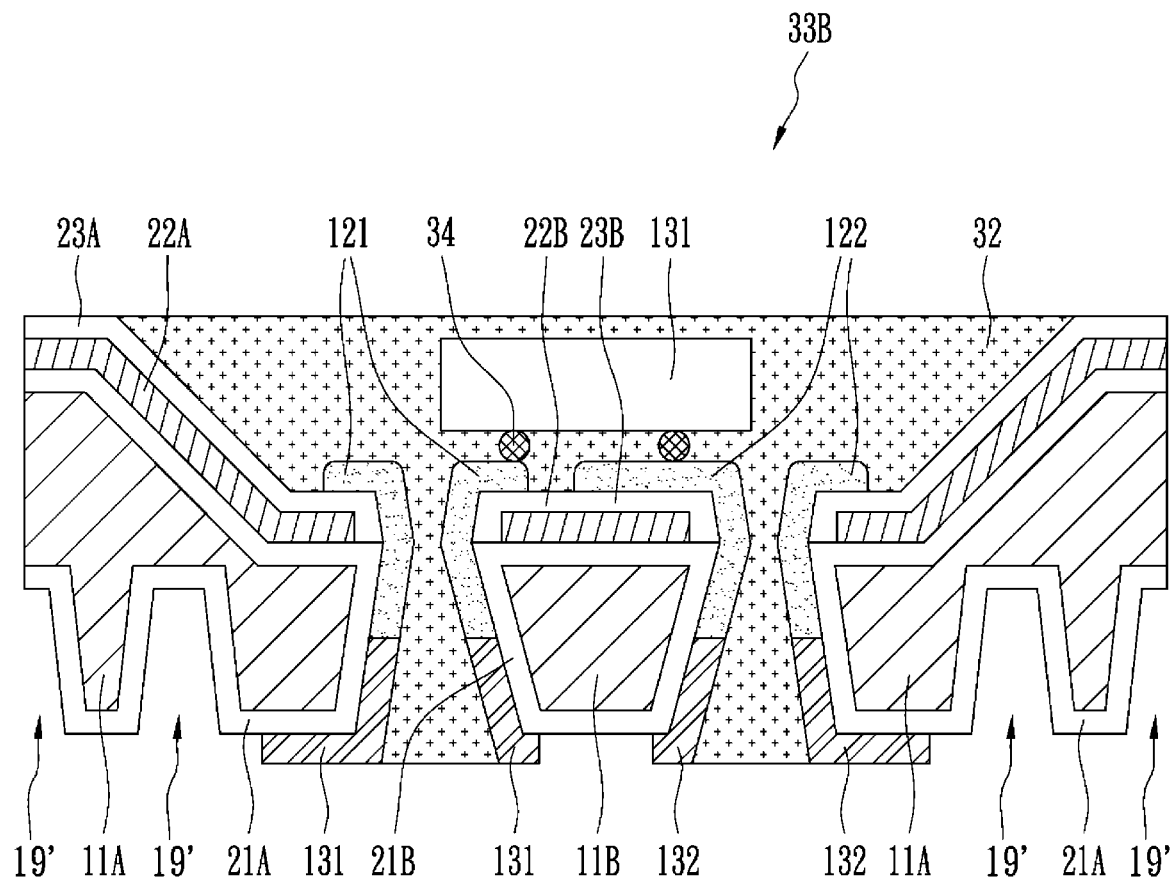

Besides wire bonding, the die 31B can also be fixed and electrically connected to the conductive layer 121 and 122 by flip-flop technique, as shown in FIG. 4A. It can be seen that there is a plurality of recesses 19' located outside the electrode via holes 17 and 18. As shown in FIG. 4B, the electrode via holes 17 and 18 are then sealed by the tape adhesive 39, and the encapsulating layer 32 is formed inside the reflective openings 16 and the electrode via holes 17 and 18. After the encapsulating layer 32 is solidified, the tape adhesive 39 is then removed. Finally, as shown in FIG. 4C, the base part 11B is cut out to form a single photoelectronic device 33B, wherein the die 31B is electrically connected to the conductive layer 121 and 122 via bumps 34.

Figure 5:
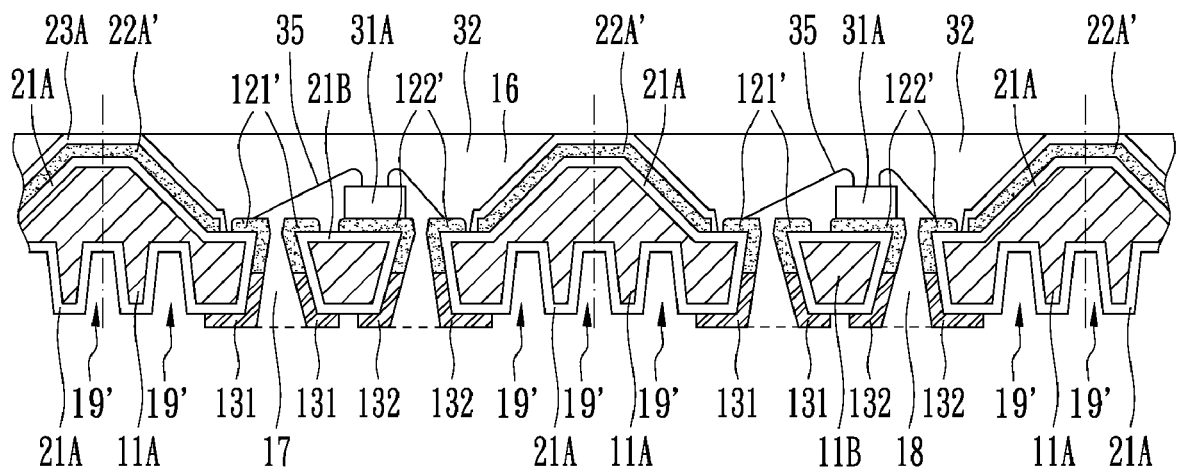
FIG. 5 shows an embodiment of the package structure of the present invention.
Figure 6:
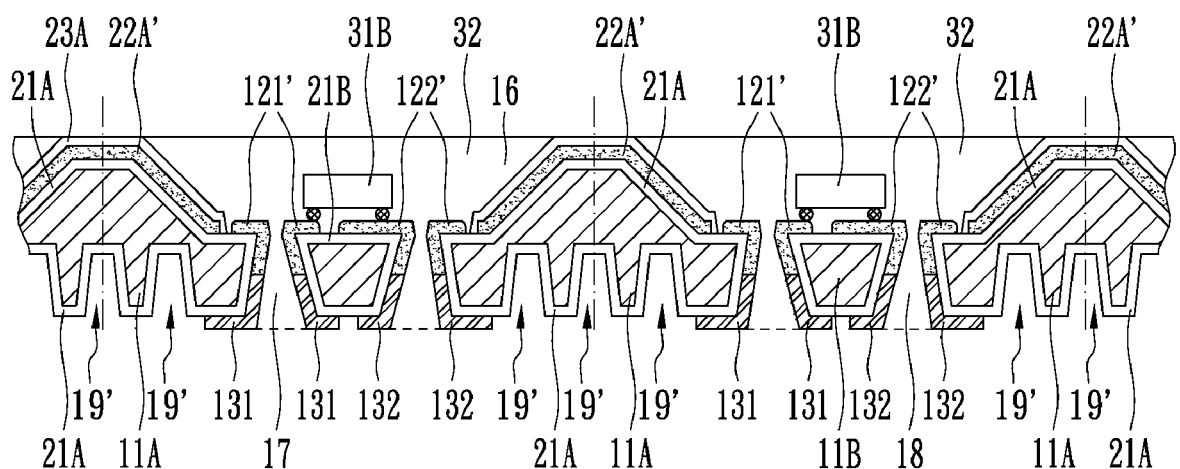
FIG. 6 shows another embodiment of the package structure of the present invention.

The conductive layer 121 and 122 and the reflective layer 22A and 22B are deposited in different steps. However, as shown in FIGS. 5 and 6, those layers can also be formed in one deposition process. FIG. 5 shows the package structure with wire bonding technique. FIG. 6 shows the package structure with flip-flop technique. The conductive layer 121' and 122' and the reflective layer 22A' are formed in one deposition process. That is, they are made of the same material.

Figure 7A:
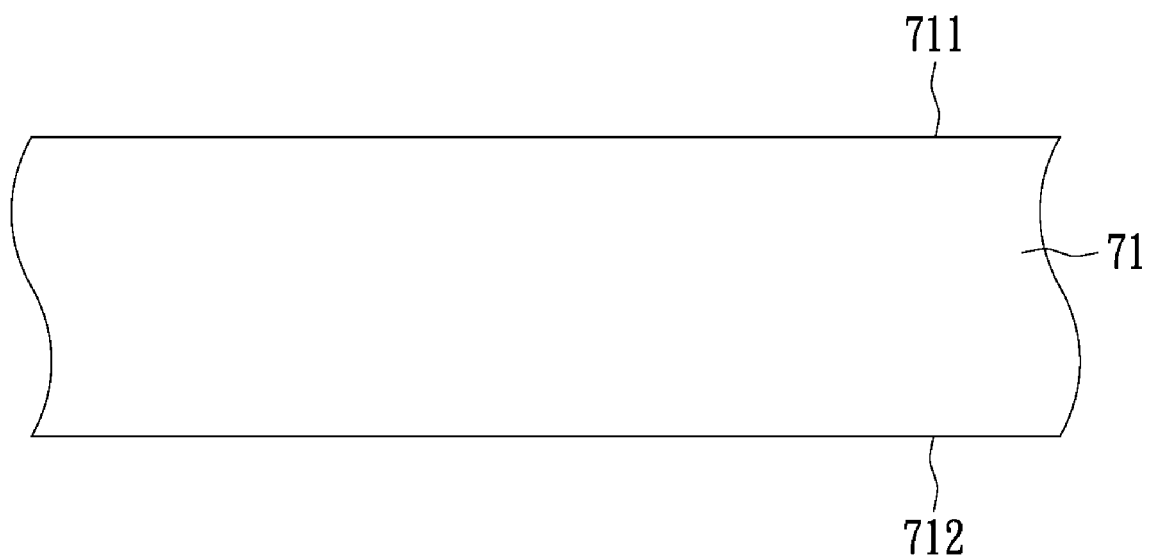
FIG. 7A to 7I show the flow chart of another embodiment of the manufacturing method for photoelectronic devices of the present invention.

FIGS. 7A to 7I show the flow chart of another embodiment of the manufacturing method for photoelectronic devices of the present invention. As shown in FIG. 7A, a silicon substrate 71 is provided, which comprises a first surface 711 and a second surface 712, wherein the first surface 711 is the upper surface and the second surface 712 is the lower surface. The silicon substrate 71 can be a 5-inch, 6-inch, 8-inch or 12-inch silicon wafer. The silicon substrate 11 may adapt a <100> crystal orientation surface. A few important advantages offered by silicon substrate 71 are its great heat dissipation capability and its suitability for well-developed semiconductor process or MEMS process.

Figure 7B:
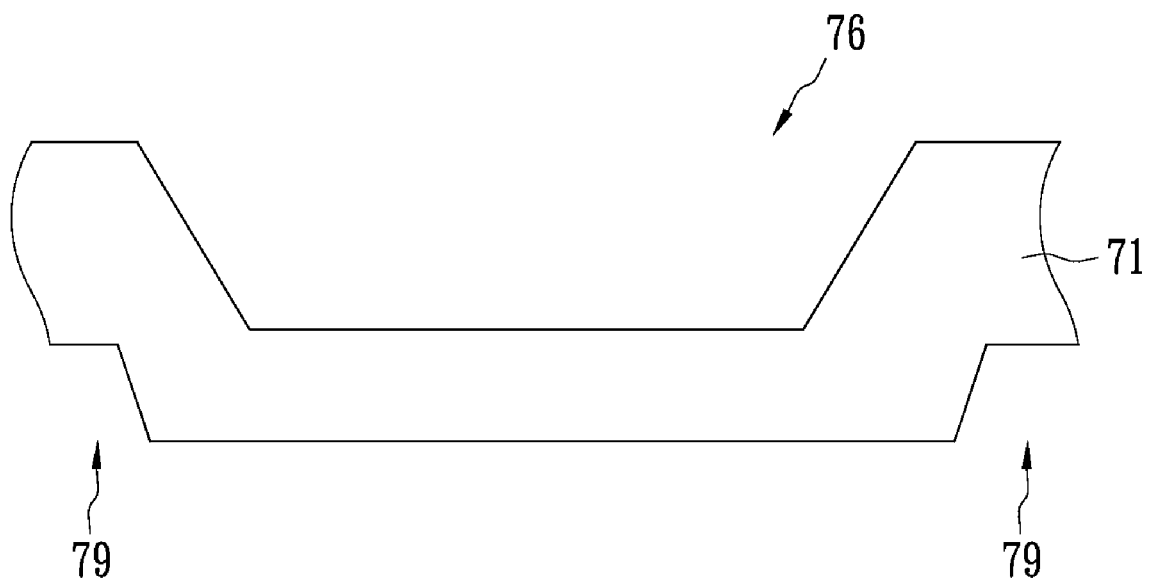

As shown in FIG. 7B, a reflective opening 76 is formed on the first surface 711 of the silicon substrate 71 by wet etching technique, and two recesses 79 are formed on each lateral side of the reflective opening 76 on the second surface 712 by wet etching technique as well. The selection of the etchant for the wet etching step can be potassium (KOH). The step in FIG. 7B includes photolithography process, i.e. transferring pattern by etching technique, such as photoresist coating, soft baking, exposure, development, hard baking, silicon substrate etching and photoresist removing. The etching profile of the reflective opening 76 and the recesses 79 is adjustable due to the isotropic of wet etching technique.

Figure 7C:
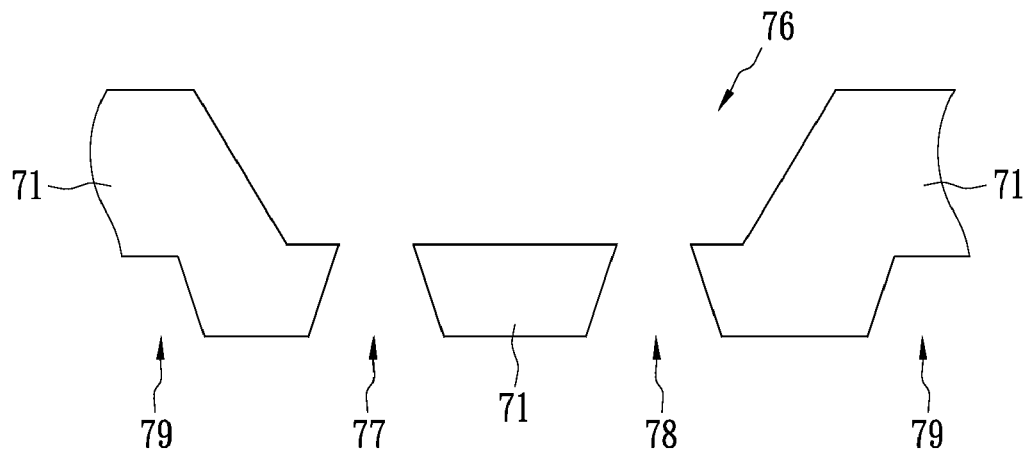

As shown in FIG. 7C, electrode via holes 77 and 78 are then formed on the second surface 712 of the silicon substrate 71 by wet etching technique. The number of the electrode via holes is not limited to two but can be more than two. For example, when more than two light emitting devices are adapted, the number of the electrode via holes 77 and 78 can be four or six. Since the electrode via holes 77 and 78 are formed by wet etching technique, the openings thereof can be made substantially bigger, which makes more room for the subsequent process window. Likewise, the step in FIG. 7C also includes photolithography process.

Figure 7D:
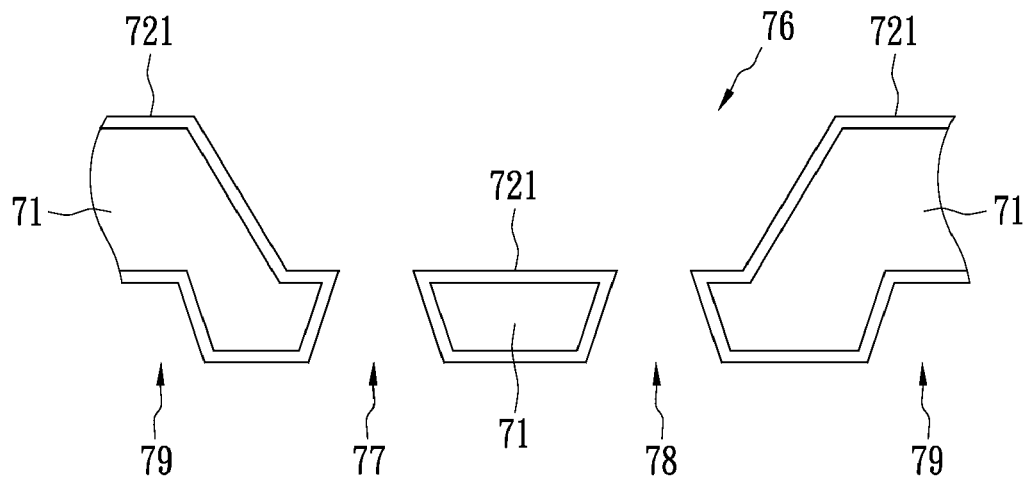

As shown in FIG. 7D, a silicon oxide layer then covers the silicon substrate 71 to serve as a first insulating layer 721. The formation of the silicon oxide layer can be accomplished by hot oxidation technique or chemical vapor deposition (CVD) technique, wherein the hot oxidation technique is preferred because the silicon oxide formed thereby exhibits a more compact structure. The hot oxidation technique can be either hot or wet hot oxidation technique in this embodiment. The first insulating layer 721 can also be made of silicon nitride.

Figure 7E:
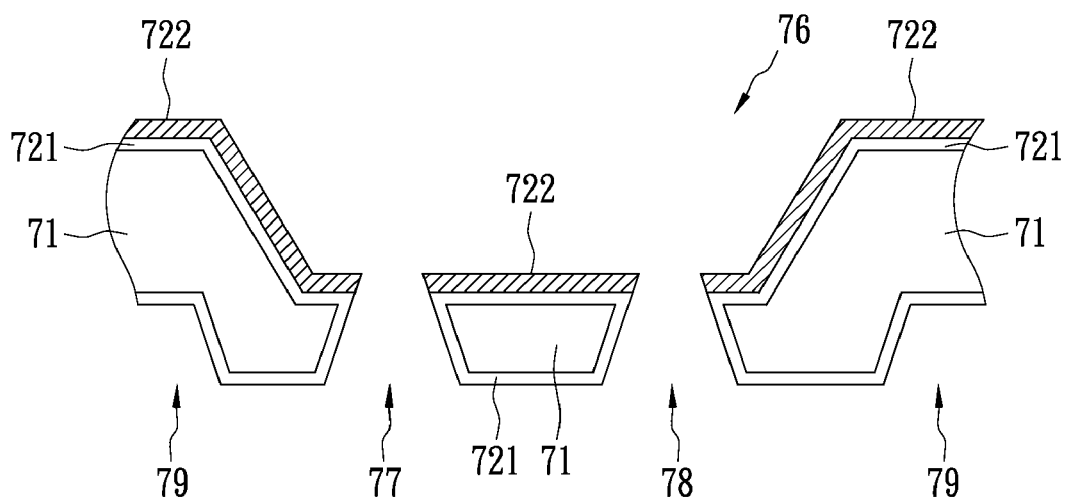

As shown in FIG. 7E, a reflective layer 722 is then formed inside the reflective opening 76. The reflective layer 722 can be made of silver (Ag), aluminum (Al), gold (Au) or tin (Sn) depending on the wavelength of the light being used. The reflective layer 722 can be formed by electroplating, evaporating or electronbeam epitaxial process. Since the reflective layer 722 is only formed on the first surface 711 of the silicon substrate 71, the process condition is relatively simple. In addition, there can be an optional step to remove the portion of the reflective layer 722 outside the reflective opening 76 after the formation of the reflective layer 722 by another etching technique.

Figure 7F:
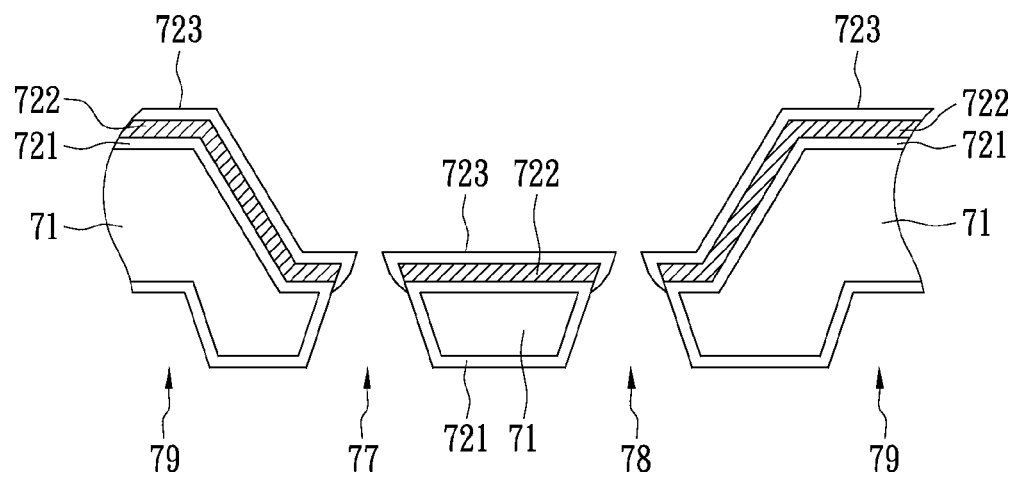

As shown in FIG. 7F, a second insulating layer 723 is then formed to cover the reflective layer 722. The second insulating layer 723 can be made of silicon oxide or silicon nitride and formed by PVD technique, wherein silicon oxide can be formed by PECVD technique and silicon nitride can be formed by LPCVD technique. The thickness of the second insulating layer 723 can be adjusted to generate a constructive interference for a specific light. The second insulating layer 723 covers the reflective layer 722 to prevent oxidation, sulfidation or other chemical reaction of the reflective metal, especially for the reflective metal made of aluminum or tin due to the fact that those two metals are prone to oxidation.

Figure 7G:
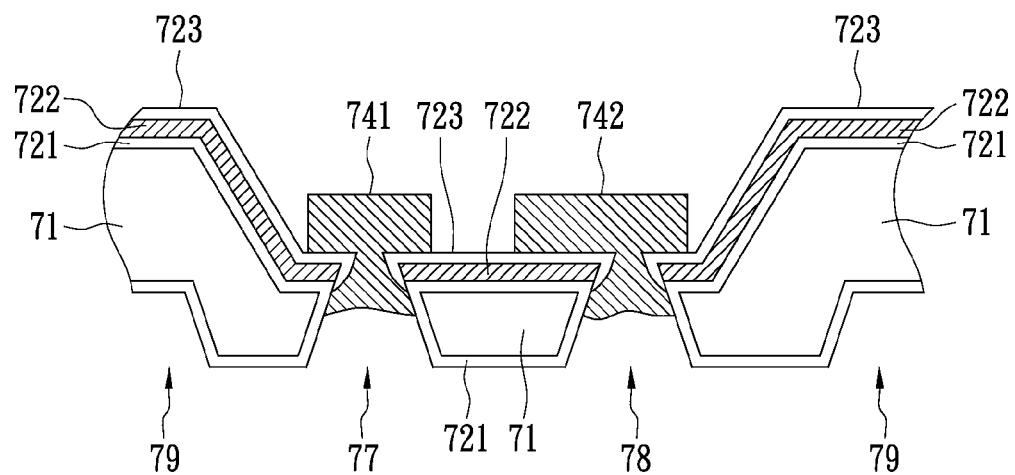

As shown in FIG. 7G, a first metal layer is then formed as front-end electrodes 741 and 742. Since the front-end electrodes 741 and 742 are primarily soldered with light emitting device, the material of the front-end electrodes 741 and 742 can be selected as solderable material depending on the packaging process, such as wire bonding or flip-flop packaging process. The front-end electrodes 741 and 742 can be formed by electroplating or evaporating technique. The pattern of the front-end electrodes 741 and 742 can be formed by pattern transfer etching or lift-off process, wherein the lift-off process is similar to the pattern transfer etching process but with different step sequence. The procedure of the lift-off process is described as follows: forming a photoresist layer, exposure, development, forming the metal layer on the photoresist layer, and removing the photoresist layer along with the metal layer on the photoresist layer. In other words, there is no etching step for metal layer in the lift-off process. Either pattern transfer etching process or lift-off process, however, is a more mature and cost-effective process than the traditional laser process.

The front-end electrodes 741 and 742 and the reflective layer 722 are electrically isolated by the second insulating layer 723, which prevents damage to devices caused by power leakage.

Figure 7H:
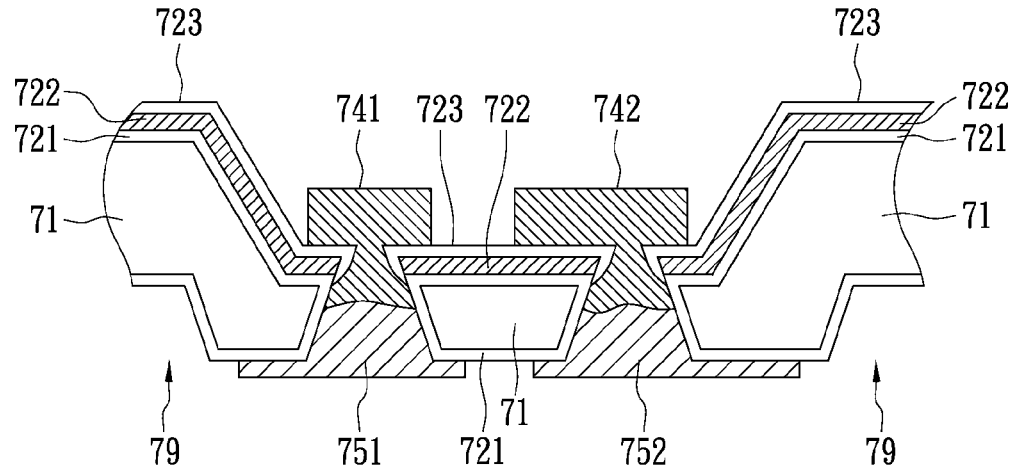

As shown in FIG. 7H, a second metal layer is then formed as back-end electrodes 751 and 752. The back-end electrodes 751 and 752 can be made of solderable material or any ordinary electrode materials. The back-end electrodes 751 and 752 are formed in the same way as the front-end electrodes 741 and 742. The pattern transfer of the back-end electrodes 751 and 752, on the other hand, can be accomplished in the same way or different from that of the front-end electrodes 741 and 742. The back-end electrodes 751 and 752 fill up the electrode via holes 77 and 78 and electrically connect with the front-end electrodes 741 and 742.

Figure 7I:
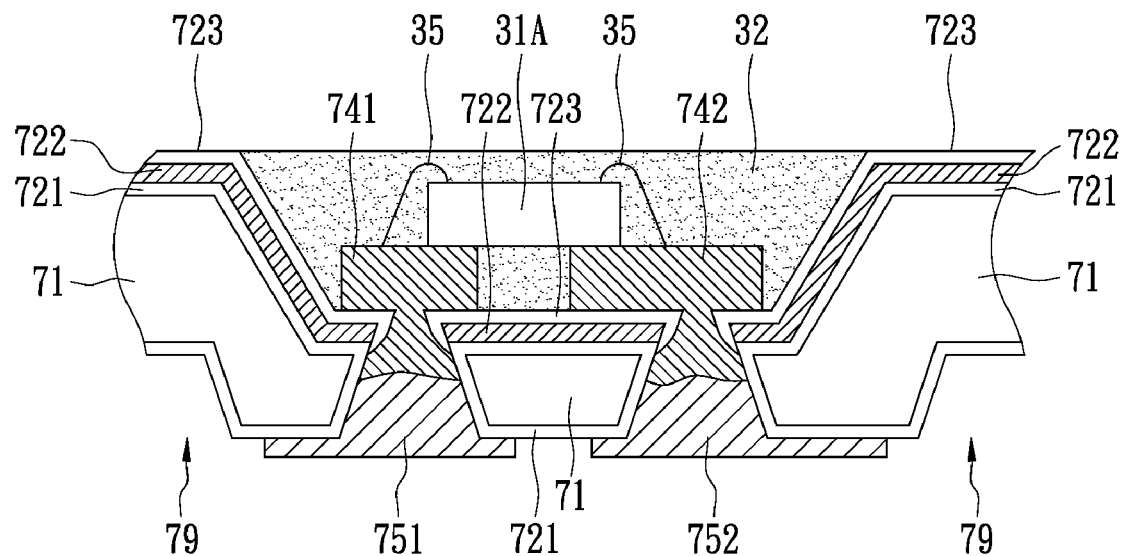

As shown in FIG. 7I, the LED die 31A is then wire bonded and covered by the encapsulating layer 32 made of epoxy. The encapsulating layer 32 can be doped with fluorescent powder such as yttrium aluminium garnet (YAG) or silicate systems. The primary formula of the silicate systems is $A_2SiO_4$, wherein A is at least one of strontium (Sr), calcium (Ca), barium (Ba), magnesium (Mg), zinc (Zn) or cadmium (Cd). The filling of the encapsulating layer 32 can be accomplished by transfer molding technique or glob injecting technique.

Figure 8:
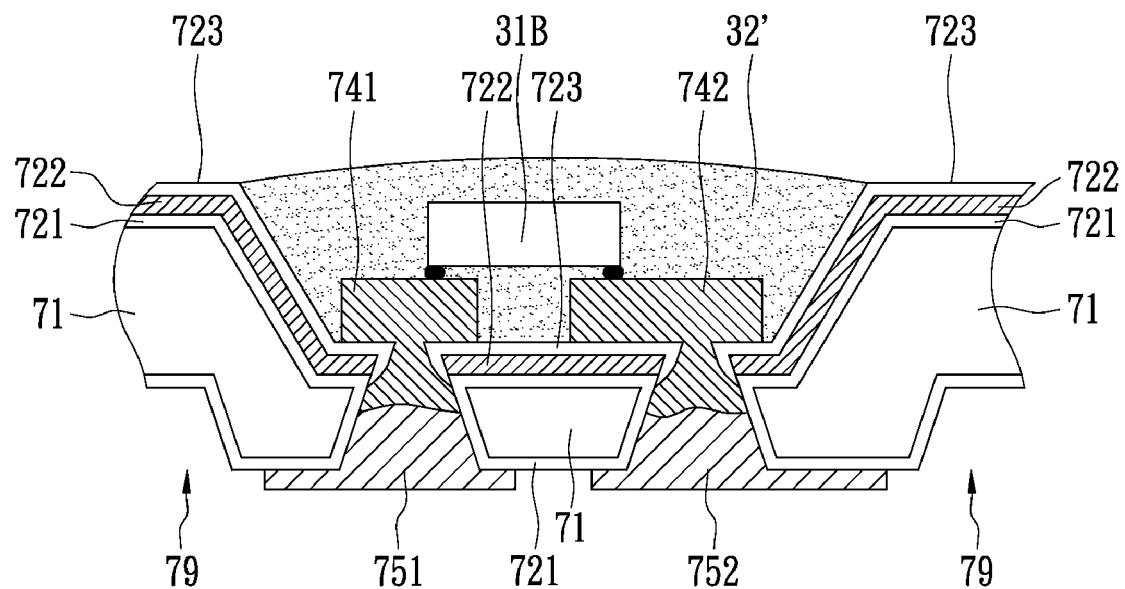
FIG. 8 shows the diagram of another embodiment of the package structure of the present invention.

As shown in FIG. 8, the LED die 31B is flip chip mounted and covered by epoxy. The encapsulating layer 32 can be doped with fluorescent powder such as yttrium aluminium garnet (YAG) or silicate systems. The filling of the encapsulating layer 32 can be accomplished by transfer molding technique or glob injecting technique.

The above-described embodiments of the present invention are intended to be illustrative only. Numerous alternative embodiments may be devised by persons skilled in the art without departing from the scope of the following claims.

What is claimed is:

1. A fabrication method of a package structure for photo-electronic devices, comprising the steps of:
   providing a silicon substrate;
   forming at least one reflective opening on a first surface of the silicon substrate;
   forming a plurality of electrode via holes and recesses on a second surface of the silicon substrate, wherein the electrode via holes penetrate through the silicon substrate to reach the at least one reflective opening, and the recesses are disposed outside the electrode via holes;
   forming a first insulating layer overlaying the at least one reflective opening, the plurality of electrode via holes and recesses;
   forming a reflective layer inside the at least one reflective opening;
   forming a second insulating layer on the reflective layer;
   forming a first conductive layer on the second insulating layer;
   forming a second conductive layer on the second surface of the silicon substrate and inside the electrode via holes; and
   fixing a die inside the reflective opening and electrically connecting the die with the first conductive layer.

2. The method of claim 1, wherein the first insulating layer is made of silicon oxide formed by a hot oxidation process.

3. The method of claim 1, wherein the second insulating layer is made of silicon dioxide, silicon nitride or silicon oxynitride deposited by vapor deposition process.

4. The method of claim 1, wherein the first conductive layer and the second conductive layer are formed by electroplating, evaporating or chemical plating techniques.

5. The method of claim 1, wherein the first conductive layer is connected to the second conductive layer.

6. The method of claim 1, wherein the die is fixed inside the reflective opening by flip-chip technique.

7. The method of claim 1, wherein the die is electrically connected to the first conductive layer by wire bonding technique.

8. The method of claim 1, which further comprises the step of filling an encapsulating layer inside the reflective opening and the electrode via holes.

9. A fabrication method of a package structure for photoelectronic devices, comprising the steps of:
   providing a silicon substrate;
   etching a first surface of the silicon substrate to form a reflective opening thereon;
   etching a second surface of the silicon substrate to form two electrode via holes and a plurality of recesses thereon, wherein the two electrode via holes penetrate the silicon substrate and reach the reflective opening, the first surface is opposed to the second surface, and the recesses are disposed outside the electrode via holes;
   forming a first insulating layer overlaying the reflective opening, the plurality of electrode via holes and recesses;
   forming a reflective layer on the reflective opening;
   forming a second insulating layer on the reflective layer;
   forming a first conductive layer on the two electrode via holes, wherein the first conductive layer serves as two electrode pads and is electrically isolated from the reflective layer; and
   forming a second conductive layer beneath the second surface and inside the two electrode via holes.

10. The method of claim 9, wherein the first insulating layer is a silicon oxide formed by a hot oxidation process.

11. The method of claim 9, wherein the reflective layer is made of a silver (Ag), aluminum (Al), gold (Au) or tin (Sn).

12. The method of claim 11, wherein the reflective layer is formed by electroplating, evaporating or electronbeam epitaxial process.

13. The method of claim 9, wherein the first conductive layer and the second conductive layer are made of a solderable material.

14. The method of claim 13, wherein the first conductive layer and the second conductive layer are formed by pattern transfer etching or lift-off process.

15. The method of claim 9, wherein the second insulating layer is made of silicon oxide formed by physical vapor deposition (PVD) technique.

16. The method of claim 9, wherein the step of etching the second surface is to form four electrode via holes, which penetrate the silicon substrate and reach the reflective opening.

17. The method of claim 16, wherein the first conductive layer serves as four electrode pads, and the second conductive layer is disposed inside the four electrode via holes and electrically connected with the first conductive layer.

18. The method of claim 9, wherein the photoelectronic device is a light-emitting diode.

* * * * *